United States Patent
Andre et al.

(10) Patent No.: US 9,282,652 B2
(45) Date of Patent: Mar. 8, 2016

(54) PORTABLE COMPUTING DEVICE WITH A HOUSING SECURED BY A MAGNETIC ELEMENT AND RELATED METHOD

(71) Applicant: Apple Inc., Cupertino, CA (US)

(72) Inventors: Bartley K. Andre, Menlo Park, CA (US); Brett W. Degner, Menlo Park, CA (US); Bradley J. Hamel, Redwood City, CA (US); William F. Leggett, San Francisco, CA (US); Christiaan A. Ligtenberg, San Carlos, CA (US); Charles A. Schwalbach, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/568,936

(22) Filed: Dec. 12, 2014

(65) Prior Publication Data
US 2015/0098183 A1   Apr. 9, 2015

Related U.S. Application Data

(63) Continuation of application No. 13/492,725, filed on Jun. 8, 2012, now Pat. No. 8,947,874.

(51) Int. Cl.
| | |
|---|---|
| *G06F 1/16* | (2006.01) |
| *H05K 5/00* | (2006.01) |
| *H05K 7/00* | (2006.01) |
| *H05K 5/02* | (2006.01) |
| *H05K 5/03* | (2006.01) |
| *F16B 1/00* | (2006.01) |

(52) U.S. Cl.
CPC ............ *H05K 5/0004* (2013.01); *G06F 1/1613* (2013.01); *G06F 1/1616* (2013.01); *G06F 1/1679* (2013.01); *H05K 5/0086* (2013.01); *H05K 5/0217* (2013.01); *H05K 5/0226* (2013.01); *H05K 5/03* (2013.01); *F16B 2001/0035* (2013.01); *Y10T 29/49826* (2015.01); *Y10T 29/49947* (2015.01)

(58) Field of Classification Search
CPC ............................. G06F 1/1613; G06F 1/1616
USPC ............... 361/679.26, 679.27, 679.3, 679.55, 361/679.56
See application file for complete search history.

(56) References Cited

U.S. PATENT DOCUMENTS

| | | | |
|---|---|---|---|
| 7,103,698 B2 * | 9/2006 | Zhang ................... | G06F 1/1632 361/679.3 |
| 2005/0083644 A1 * | 4/2005 | Song ....................... | G06F 1/162 361/679.06 |
| 2007/0133156 A1 * | 6/2007 | Ligtenberg ............ | G06F 1/1616 361/679.27 |

* cited by examiner

*Primary Examiner* — Anthony Haughton
(74) *Attorney, Agent, or Firm* — Downey Brand LLP

(57) ABSTRACT

Magnetic elements and attractors may be employed to secure a top case and a bottom case of a housing of a personal computing device. The magnetic elements may include a magnet that produces a magnetic field and a shunt. The shunt may direct the magnetic field through an opening to a pocket in which the magnet is received. Accordingly, flux leakage may be reduced and the bottom case may be secured to the top case. Magnetic elements and attractors may also be employed to secure a lid portion of the portable computing device to the housing thereof. These magnetic elements and attractors may be centered with respect to proximal and distal edges thereof

20 Claims, 15 Drawing Sheets

PORTABLE COMPUTING DEVICE WITH A HOUSING SECURED BY A MAGNETIC ELEMENT AND RELATED METHOD

CROSS-REFERENCE TO RELATED APPLICATIONS

This is a continuation of U.S. patent application Ser. No. 13/492,725 filed Jun. 8, 2012 entitled "PORTABLE COMPUTING DEVICE WITH A HOUSING SECURED BY A MAGNETIC ELEMENT AND RELATED METHOD", which is incorporated herein by reference in its entirety.

FIELD

The present disclosure relates generally to portable computing device with a magnetic element, and more particularly to a portable computing device including a top case and a bottom case secured by a magnetic element and related method.

BACKGROUND

Portable computing devices often employ housings formed at least in part by top and bottom cases. Various components of the portable computing devices may be stored therein. In this regard, the housing may provide the portable computing device with structure, define an ergonomic form factor, protect the internal components and/or or perform a variety of related functions.

The top case and the bottom case may be configured to be separable such that the internal components of the portable computing device may be serviced, replaced, upgraded, or otherwise accessed. Various embodiments of fasteners and attachment mechanisms may be employed to secure the top case and the bottom case together. However, existing embodiments of attachment mechanisms may be difficult to use.

Accordingly, improved portable computing devices and attachment mechanisms for housings thereof may be desirable.

SUMMARY

Magnetic fastener arrangements are provided. The magnetic fasteners may comprise magnetic elements and attractors. The magnetic elements may be received in a pocket in a top case of a housing for a personal computing device. The attractors may be attached to, or integral with a bottom case for the personal computing device. The magnetic elements may include at least one magnet and a shunt. The magnet may produce a magnetic field configured to attract the attractor. The shunt may direct the magnetic field through an opening in the pocket such that the magnetic field may attract the attractor while reducing flux leakage. A Hall Effect sensor may be employed to detect when there is a change in the magnetic field associated with opening the rear cover.

Magnetic elements and attractors may also be employed to releasably secure a housing to a lid portion of a portable computing device. Magnetic elements and attractors may be respectively coupled to one of the lid portion and the housing. The magnetic elements and the attractors may be positioned substantially centered between the proximal and distal edges thereof such that the moment arm associated with the magnetic force is reduced.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed apparatuses, assemblies, methods, and systems. These drawings in no way limit any changes in form and detail that may be made to the disclosure by one skilled in the art without departing from the spirit and scope of the disclosure.

DETAILED DESCRIPTION

Figure 1:
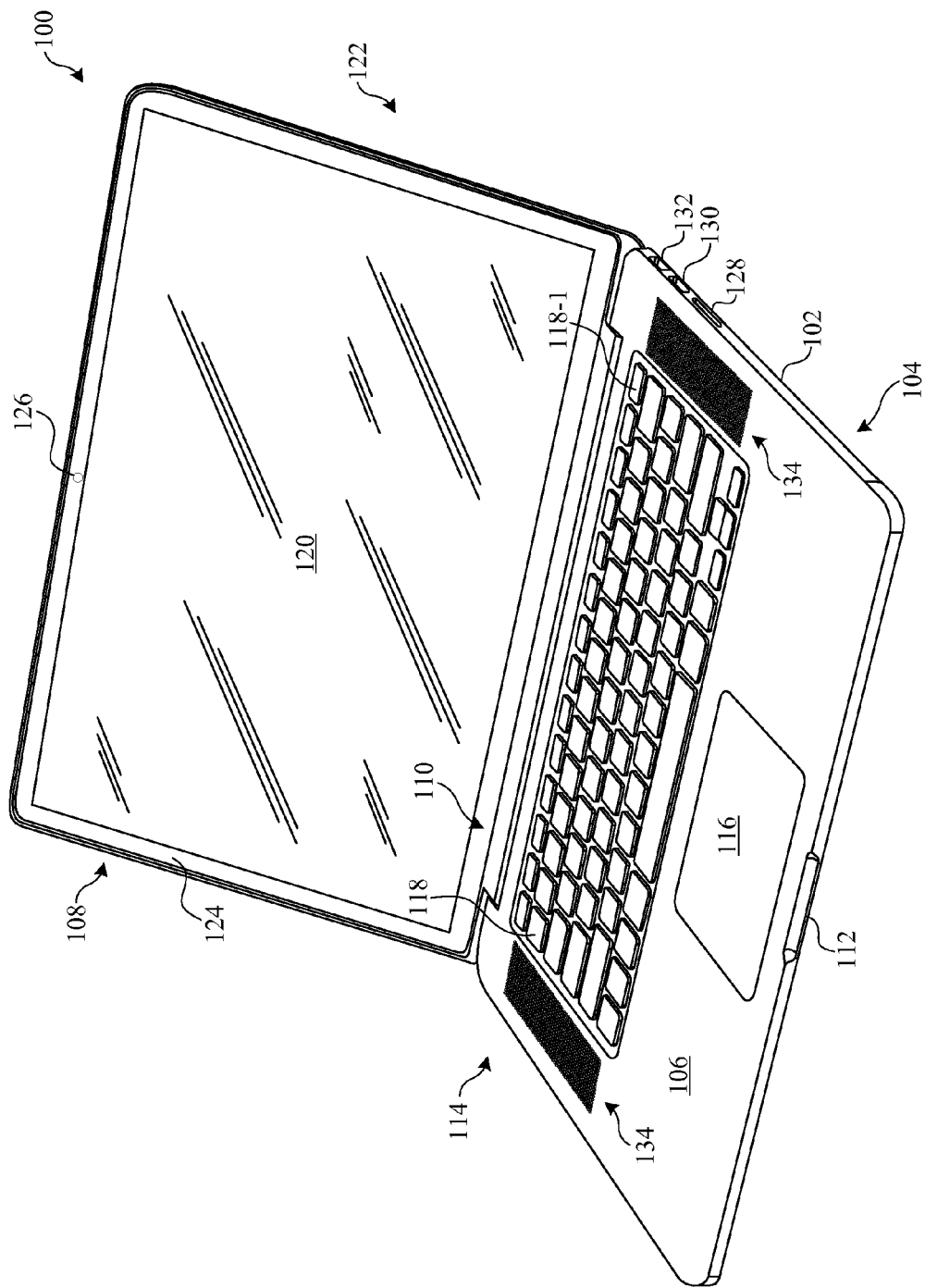
FIG. 1 shows a front facing perspective view of an embodiment of the portable computing device in the form of portable computing device in an open (lid) state according to an example embodiment of the present disclosure.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The following relates to a portable computing device such as a laptop computer, net book computer, tablet computer, etc. The portable computing device can include a multi-part housing having a top case and a bottom case joining at a reveal to form a base portion or housing. The portable computing device can have an upper portion (or lid) that can house a display screen and other related components whereas the housing can house various processors, drives, ports, battery, keyboard, touchpad and the like. The top case and the bottom case can each be joined in a particular manner at an interface region such that the gap and offset between top and bottom cases are not only reduced, but are also more consistent from device to device during the mass production of devices. These general subjects are set forth in greater detail below.

In a particular embodiment, the lid and housing can be pivotally connected with each other by way of what can be referred to as a clutch assembly. The clutch assembly can be arranged to pivotally couple the housing to the lid. The clutch assembly can include at least a cylindrical portion that in turn includes an annular outer region, and a central bore region surrounded by the annular outer region, the central bore suitably arranged to provide support for electrical conductors between the housing and electrical components in the lid. The clutch assembly can also include a plurality of fastening regions that couple the clutch to the housing and the lid of the portable computing device with at least one of the fastening regions being integrally formed with the cylindrical portion such that space, size and part count are minimized.

The top case can include a cavity, or lumen, into which a plurality of operational components can be inserted during an assembly operation. In the described embodiment, the operational components can inserted into the lumen and attached to the top case in an "top-bottom" assembly operation in which top most components are inserted first followed by components in a top down arrangement. For example, the top case can be provided and shaped to accommodate a keyboard module. The keyboard module can include a keyboard assembly formed of a plurality of keycap assemblies and associated circuitry, such as a flexible membrane on which can be incorporated a switching matrix and protective feature plate. Therefore, following the top-bottom assembly approach, the keyboard assembly is first inserted into the top case followed by the flexible membrane and then the feature plate that is attached to the top case. Other internal components can then be inserted in a top to bottom (when viewed from the perspective of the finished product) manner.

In one embodiment, the keyboard module can be configured in such a way that a keycap assembly can be used to replace a power switch. For example, in a conventional keyboard each of a top row of keycaps can be assigned at least one function. However, by re-deploying one of the keycaps as a power button, the number of operational components can be reduced by at least eliminating the switch mechanism associated with the conventional power button and replacing it with the already available keycap assembly and associated circuitry.

In addition to the keyboard, the portable computing device can include a touch sensitive device along the lines of a touch pad, touch screen, etc. In those embodiments where the portable computing device includes a touch pad the touch pad can be formed from a glass material. The glass material provides a cosmetic surface and is the primary source of structural rigidity for the touchpad. The use of the glass material in this way significantly reduces the overall thickness of the touchpad compared to previous designs. The touchpad can include circuitry for processing signals from a sensor associated with the touchpad. In one embodiment, the circuitry can be embodied as a printed circuit board (PCB). The PCB can be formed of material and placed in such a way that provides structural support for the touchpad. Thus, a separate touchpad support is eliminated.

In one embodiment, the top case can be formed from a single billet of aluminum that is machined into a desired shape and size. The top case can include an integrated support system that adds to the structural integrity of the top case. The integrated support system can be continuous in nature in that there are no gaps or breaks. The integrated support system can be used to provide support for individual components (such as a keyboard). For example, the integrated support system can take the form of ribs that can be used as a reference datum for a keyboard. The ribs can also provide additional structural support due to the added thickness of the ribs. The ribs can also be used as part of a shield that help to prevent light leaking from the keyboard as well as act as a Faraday cage that prevents leakage of extraneous electromagnetic radiation.

The continuous nature of the integrated support system can result in a more even distribution of an external load applied to the multi-part housing resulting in a reduced likelihood of warping, or bowing that reduces risk to internal components. The integrated support system can also provide mounting structures for those internal components mounted to the multi-part housing. Such internal components include a mass storage device (that can take the form of a hard disk drive, HDD, or solid state drive, SSD), audio components (audio jack, microphone, speakers, etc.) as well as input/output devices such as a keyboard and touch pad.

These and other embodiments are discussed below with reference to FIGS. 1-15. However, those skilled in the art will readily appreciate that the detailed description given herein with respect to these figures is for explanatory purposes as the invention extends beyond these limited embodiments.

FIGS. 1-15 show various views of the portable computing device in accordance with various embodiments. FIG. 1 shows a front facing perspective view of an embodiment of the portable computing device in the form of portable computing device 100 in an open (lid) state. Portable computing device 100 can include base portion or "housing" 102 formed of bottom case 104 fastened to top case 106. Housing 102 can be pivotally connected to lid portion 108 by way of clutch assembly 110 hidden from view by a cosmetic wall. Housing 102 can have an overall uniform shape sized to accommodate clutch assembly 110 and inset portion 112 suitable for assisting a user in lifting lid portion 108 by, for example, a finger. Top case 106 can be configured to accommodate various user input devices such as keyboard 114 and touchpad 116. Keyboard 114 can include a plurality of low profile keycap assemblies each having an associated key pad 118. In one embodiment, an audio transducer (not shown) can use selected portions of keyboard 114 to output audio signals such as music. In the described embodiment, a microphone can be located at a side portion of top case 106 that can be spaced apart to improve frequency response of an associated audio circuit.

Each of the plurality of key pads 118 can have a symbol imprinted thereon for identifying the key input associated with the particular key pad. Keyboard 114 can be arranged to receive a discrete input at each keypad using a finger motion referred to as a keystroke. In the described embodiment, the symbols on each key pad can be laser etched thereby creating an extremely clean and durable imprint that will not fade under the constant application of keystrokes over the life of portable computing device 100. In order to reduce component count, a keycap assembly can be re-provisioned as a power button. For example, key pad 118-1 can be used as power button 118-1. In this way, the overall number of components in portable computing device 100 can be commensurably reduced.

Touch pad 116 can be configured to receive finger gesturing. A finger gesture can include touch events from more than one finger applied in unison. The gesture can also include a single finger touch event such as a swipe or a tap. The gesture can be sensed by a sensing circuit in touch pad 116 and converted to electrical signals that are passed to a processing unit for evaluation. In this way, portable computing device 100 can be at least partially controlled by touch.

Lid portion 108 can be moved with the aid of clutch assembly 110 from the closed position to remain in the open position and back again. Lid portion 108 can include display 120 and rear cover 122 (shown more clearly in FIG. 2) that can add a cosmetic finish to lid portion 108 and also provide structural support to at least display 120. In the described embodiment, lid portion 108 can include mask (also referred to as display trim) 124 that surrounds display 120. Display trim 124 can be formed of an opaque material such as ink deposited on top of or within a protective layer of display 120. Display trim 124 can enhance the overall appearance of display 120 by hiding operational and structural components as well as focusing attention onto the active area of display 120.

Display 120 can display visual content such as a graphical user interface, still images such as photos as well as video media items such as movies. Display 120 can display images using any appropriate technology such as a liquid crystal display (LCD), OLED, etc. Portable computing device 100 can also include image capture device 126 located on a transparent portion of display trim 124. Image capture device 126 can be configured to capture both still and video images. Lid portion 108 can be formed to have uni-body construction that can provide additional strength and resiliency to lid portion 108 which is particularly important due to the stresses caused by repeated opening and closing. In addition to the increase in strength and resiliency, the uni-body construction of lid portion 108 can reduce overall part count by eliminating separate support features.

Data ports 128-132 can be used to transfer data and/or power between an external circuit(s) and portable computing device 100. Data ports 128-132 can include, for example, input slot 128 that can be used to accept a memory card (such as a FLASH memory card), data ports 130 and 132 can take be used to accommodate data connections such as USB, FireWire, Thunderbolt, and so on. In some embodiments, speaker grid 134 can be used to port audio from an associated audio component enclosed within housing 102.

Figure 2:
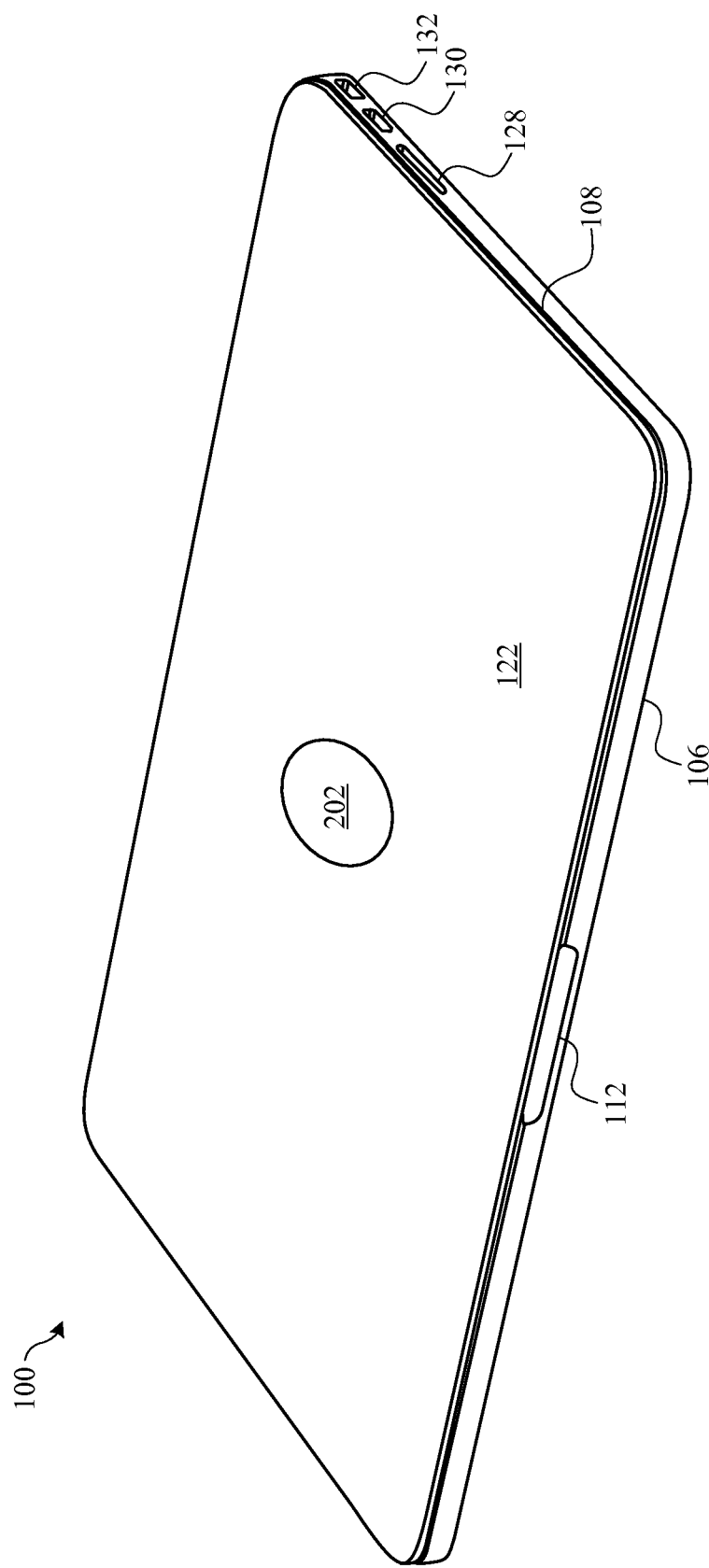
FIG. 2 shows the portable computing device of FIG. 1 in a closed (lid) configuration that shows rear cover and logo according to an example embodiment of the present disclosure.

FIG. 2 shows the portable computing device 100 in a closed (lid) configuration that shows rear cover 122 and logo 202. In one embodiment, logo 202 can be illuminated by light from display 120. It should be noted that in the closed configuration, lid portion 108 and housing 102 form what appears to be a uniform structure having a continuously varying and coherent shape that enhances both the look and feel of portable computing device 100.

Figure 3:
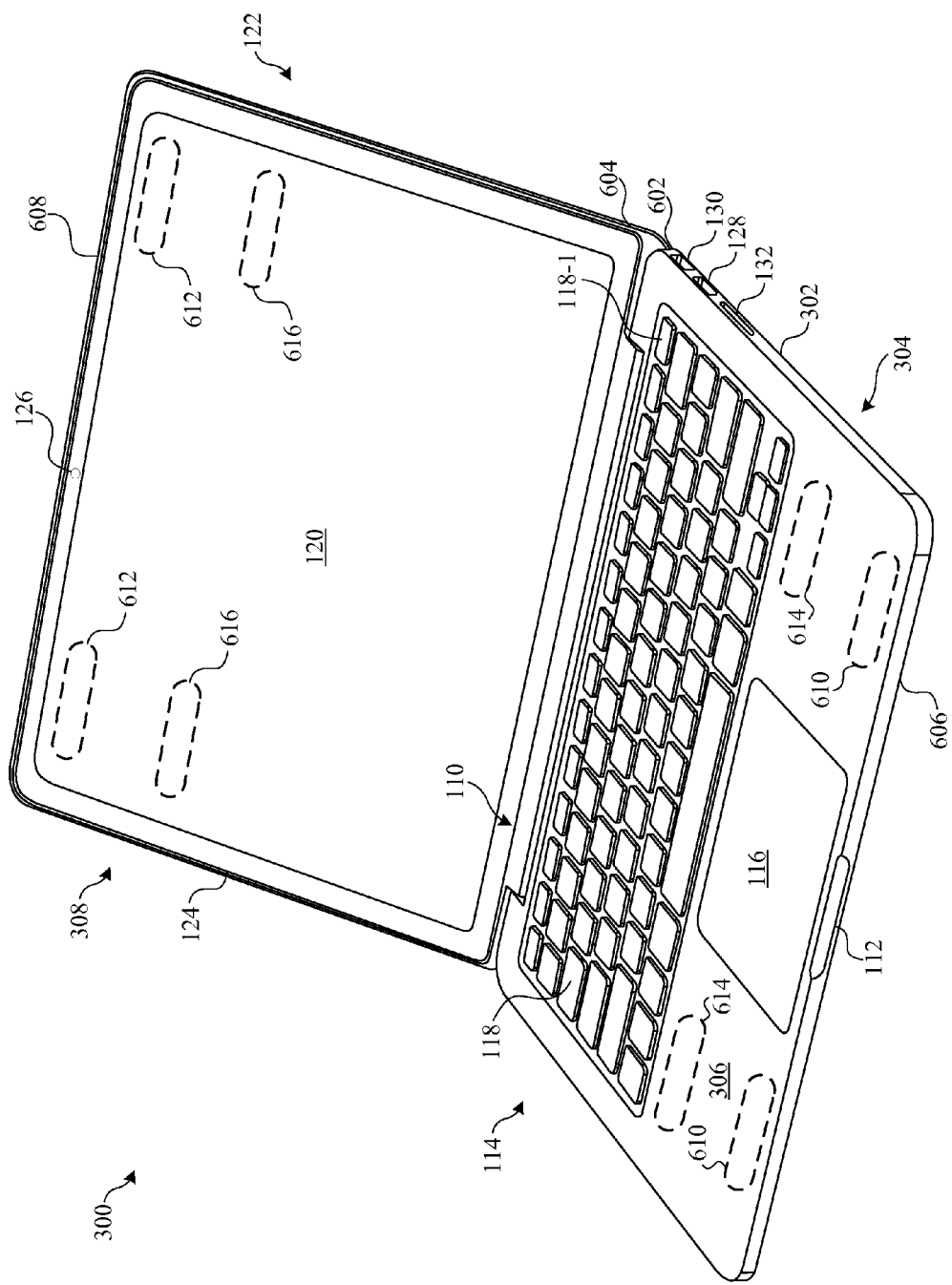
FIG. 3 shows another embodiment of the portable computing device in an open state according to an example embodiment of the present disclosure.

FIG. 3 shows another embodiment in the form of portable computing device 300 that is smaller than portable computing device 100. Since portable computing device 300 is smaller in size than portable computing device 100, certain features shown in FIG. 1 are modified, or in some cases lacking, in portable computing device 300. For example, housing 302 can be reduced in size such that separate speakers (such as speaker grid 134) are replaced with an audio port embodied as part of keyboard 114. However, bottom case 304 and top case 306 can retain many of the features described with regards to portable computing device 100 (such as display 120 though reduced to an appropriate size).

Figure 4:
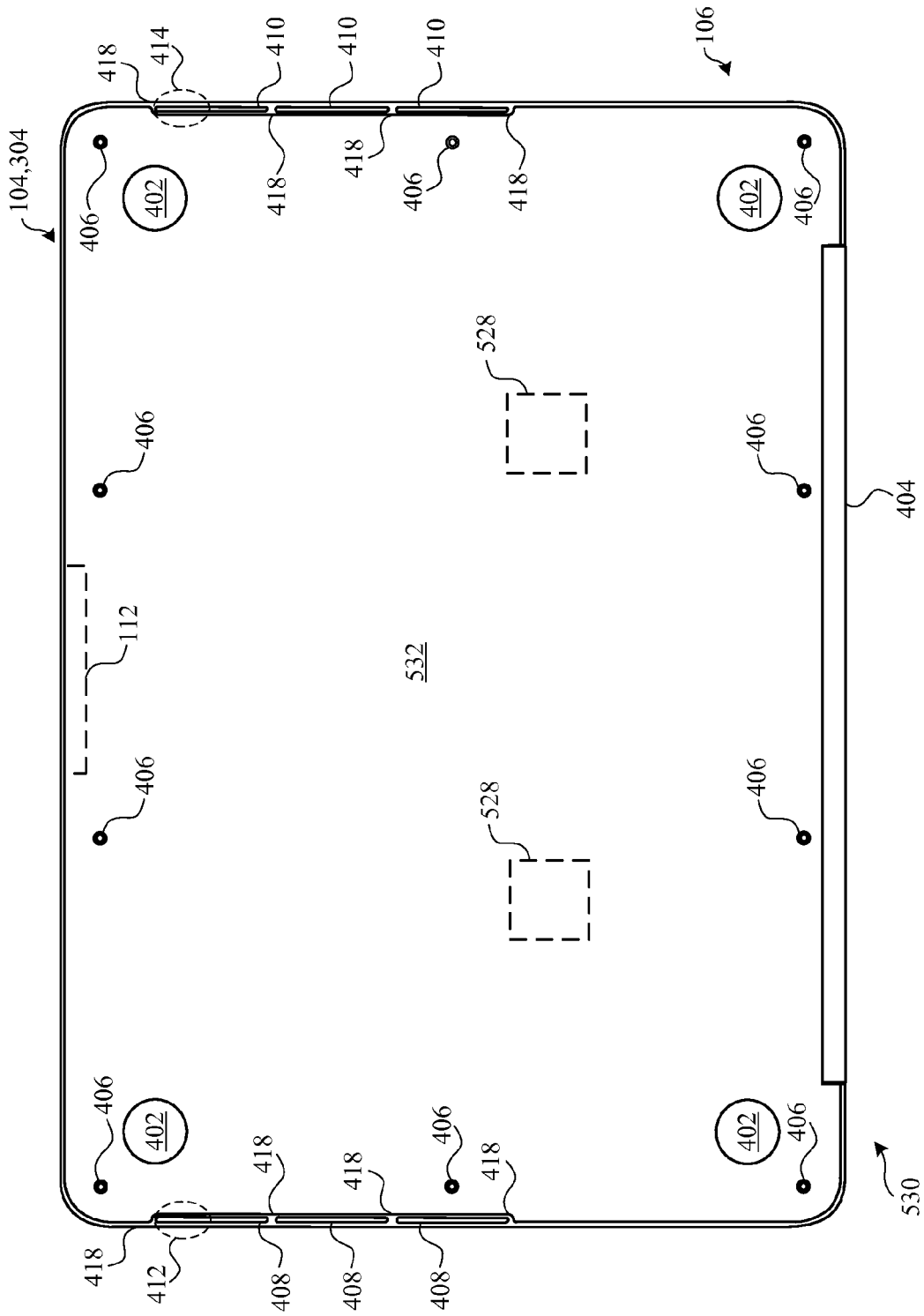
FIG. 4 shows an external view of the bottom case of the portable computing device of FIG. 1 or 3 according to an example embodiment of the present disclosure.

FIG. 4 shows an external view of bottom case 104 showing relative positioning of support feet 402, insert 112, and cosmetic wall 404 that can be used to conceal clutch assembly 110. Fasteners may extend through holes 406 to secure the bottom case 104 and the top case 106 together. Support feet 402 can be formed of wear resistant and resilient material such as plastic. Also in view are multi-purpose front side sequentially placed vents 408 and 410 that can be used to provide a flow of outside air that can be used to cool internal components. In the described embodiment, vents 408 and 410 can be placed on an underside of top cover 106 in order to hide the vents from view as well as obscure the view of an interior of portable computing device 100 from the outside. Vents 408 and 410 can act as a secondary air intake subordinate to primary air intake vents located at a rear portion of portable computing device 100 (described below). In this way, vents 408 and 410 can help to maintain an adequate supply of cool air in those situations where portions of the rear vents are blocked or otherwise have their air intake restricted.

Vents 408 and 410 can also be used to output audio signals in the form of sound generated by an audio module (not shown). In one embodiment, a selected portion (such as portions 412 and 414) can be used to output sound at a selected frequency range in order to improve quality of an audio presentation by portable computing device 100. Vents 408 and 410 can be part of an integrated support system in that vents 408 and 410 can be machined from the outside and cut from the inside during fabrication of top case 106. As part of the machining of vents 408 and 410, stiffener ribs 416 (shown in FIG. 5) can be placed within vent openings 408 and 410 to provide additional structural support for portable computing device 100. Stiffener ribs 416 can be formed using what is referred to as a T cutter that removes material subsequent to the formation of the vent openings during the fabrication of top case 106.

Moreover, trusses 418 can be formed between vents 408 and 410 in combination with ribs 416 can add both structural support as well as assist in defining both the cadence and size of vents 408 and 410. The cadence and size of vents 408 and 410 can be used to control air flow into portable computing device 100 as well as emission of RF energy in the form of EMI from portable computing device 100. Accordingly, stiffener ribs 416 can separate an area within vents 408 and 410 to produce an aperture sized to prevent passage of RF energy. As well known in the art, the size of an aperture can restrict the emission of RF energy having a wavelength that can be "trapped" by the aperture. In this case, the size of vents 408 and 410 is such that a substantial portion of RF energy emitted by internal components can be trapped within portable computing device 100. Furthermore, by placing vents 408 and 410 at a downward facing surface of top case 106, the aesthetics of portable computing device 100 can be enhanced since views of internal components from an external observer are eliminated.

The portable computing device may include additional features configured to enhance use thereof. In this regard, the housing 102, 302 (see, e.g., FIGS. 1 and 3) may comprise the top case 106, 306 (see, e.g., FIGS. 1 and 3) and the bottom case 104, 304 (see, e.g., FIG. 4). Thus, the portable computing device may include features configured to facilitate attachment of the bottom case 104, 304 to the top case 106, 306.

Figure 5:
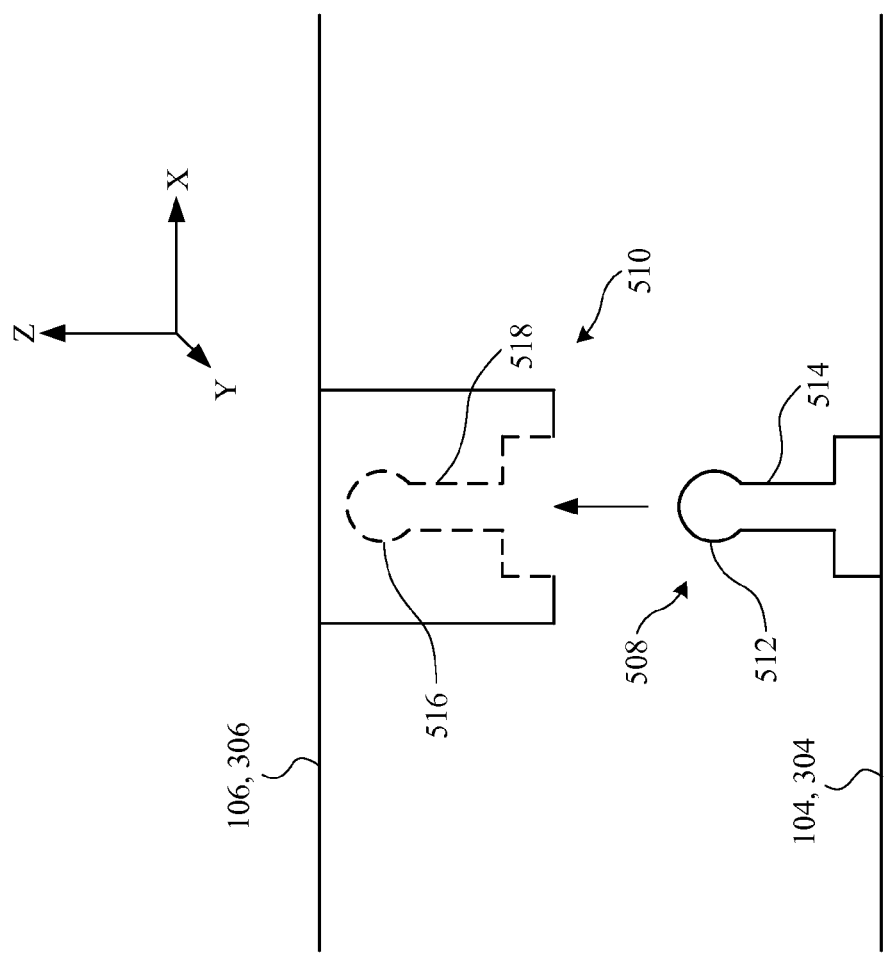
FIG. 5 schematically illustrates a side view of a mechanical fastener according to an example embodiment of the present disclosure.

In one embodiment mechanical fasteners may be employed to secure the bottom case 104, 304 to the top case 106, 306, as schematically illustrated in FIG. 5. For example, a protrusion 508 may extend from the bottom case 104, 304 and a corresponding receptacle 510 may extend from the top case 106, 306. As illustrated, the protrusion 508 may include a tip 512 that is larger than a stem 514 to which the tip is coupled. The receptacle 510 may include corresponding tip 516 and stem 518 portions respectively configured to receive the tip 512 and stem 514 of the protrusion 508. Accordingly, the tip 512 of the protrusion 508 may secure to the tip portion 516 of the receptacle 510 via interference fit when inserted therein.

However, use of mechanical fasteners may not be ideal. In this regard, mechanical fasteners may require a relatively large amount of height along the Z-axis. Further, mechanical fasteners may not provide compliance along the X and Y-axes. In this regard, screws or other fasteners may be employed to secure outer edges of the top case 106, 306 and the bottom case 104, 304 together after initially securing the top case and the bottom case together with the mechanical fasteners. Accordingly, if the protrusion 508 is improperly positioned with respect to the bottom case 104, 304 or if the receptacle 510 is improperly positioned with respect to the top case 106, 306, the top case and the bottom case may be misaligned when the protrusion and the receptacle are coupled together and thereby it may be difficult to secure the edges of the top case to the edges of the bottom case with additional fasteners.

Further, mechanical fasteners may require increased force during insertion to fully engage, and hence a user may be unaware that a mechanical fastener is not fully engaged after attempting to insert the protrusion 508 into the receptacle 510. Also, during a drop event, if the protrusion 508 pops out of the receptacle 510, the protrusion may remain disengaged due to the extra force required to engage the tip 512 in the tip portion 516 of the receptacle 510. Accordingly, the bottom case 104, 304 may bow outwardly from the top case 106, 306, and hence the bottom case may rub on a surface on which the portable computing device is placed. Further, when the bottom case 104, 304 is bowed outwardly, the shock dynamics of the portable computing device associated with a drop event may be affected. Also, it may be possible to inadvertently damage internal components of the personal computing device with the protrusions 508 if they are misaligned with the receptacles 510 during attachment of the bottom case 104, 304 to the top case 106, 306.

Figure 6:
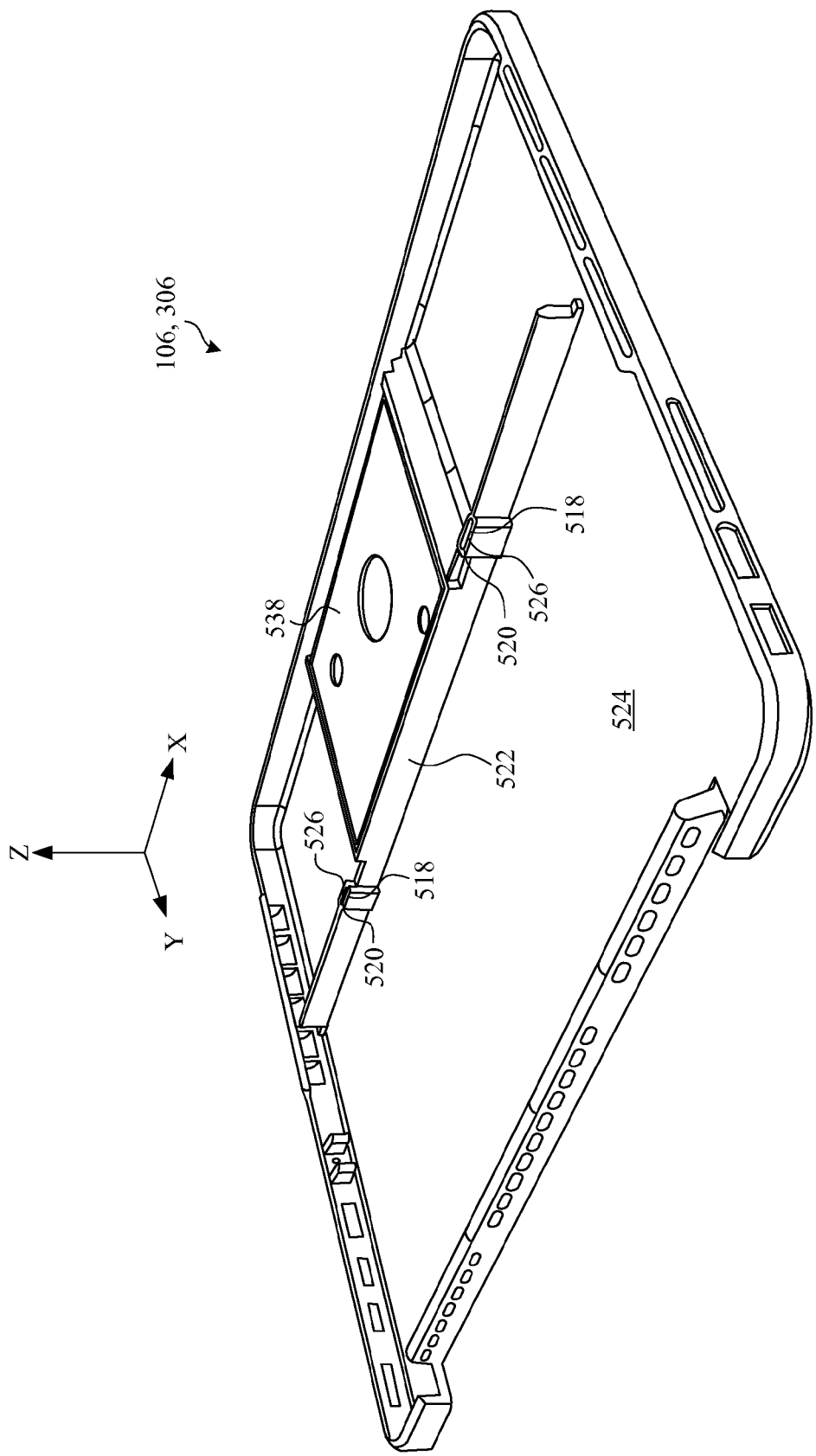
FIG. 6 illustrates a perspective view of a top case according to an example embodiment of the present disclosure.

Accordingly, alternate embodiments of mechanisms for fastening the bottom case 104, 304 to the top case 106, 306 are provided. As illustrated in FIG. 6, in one embodiment the top case 106, 306 may define one or more pockets 518 each respectively comprising an opening 520. The pockets 518 may be defined in one or more walls 522 extending from an inner surface 524 of the top case 106, 306. As illustrated, the top case 106, 306 may comprise a uni-body top case with the walls 522 comprising integral portions thereof extending from the inner surface 524. Use of a uni-body top case may provide a relatively strong and lightweight structure with precise positioning of the portions thereof. However, in other embodiments the walls 522 and/or other components of the top case 106, 306 may comprise separate structures that are attached thereto.

A magnetic element 526 may be received in each pocket 518. Various embodiments of magnetic elements 526 may be employed, as will be described below. Generally, however, the magnetic elements 526 may be configured to produce a magnetic field and secure the bottom case 104, 304 to the top case 106, 306. In the illustrated embodiment the portable computing device includes two pockets 518 with magnetic elements 526 respectively received therein. In this regard, as illustrated in FIGS. 1 and 3, the housing 102, 302 may define a rectangular configuration, with the two pockets 518 and magnetic elements 526 spaced along the longer dimension thereof to secure the housing 102, 302 along the length thereof. However, various other numbers of pockets 518 and magnetic elements 526 may be employed in other embodiments.

In this regard, in one embodiment the bottom case 104, 304 may comprise a ferromagnetic material or an iron-based material such as low carbon steel, which is configured to attract to the magnetic field produced by the magnetic elements 526. Thus, in one embodiment the bottom case 104, 304 may itself comprise an attractor. In other words, the attractor may be integral with the bottom case 104, 304.

However, in another embodiment, as illustrated in FIG. 4, the bottom case 104, 304 may comprise one or more separate attractors 528 configured to attract to the magnetic field produced by the magnetic elements 526. The attractors 528 may comprise a ferromagnetic material or an iron-based material such as low carbon steel, which is configured to attract to the magnetic field produced by the magnetic elements 526. By way of example, the attractors may comprise plates that are secured to an inner surface 530 of the bottom case 104, 304 (note that FIG. 4 illustrates an outer surface 532 of the bottom case, with the attractors 528 illustrated in phantom).

Figure 7:
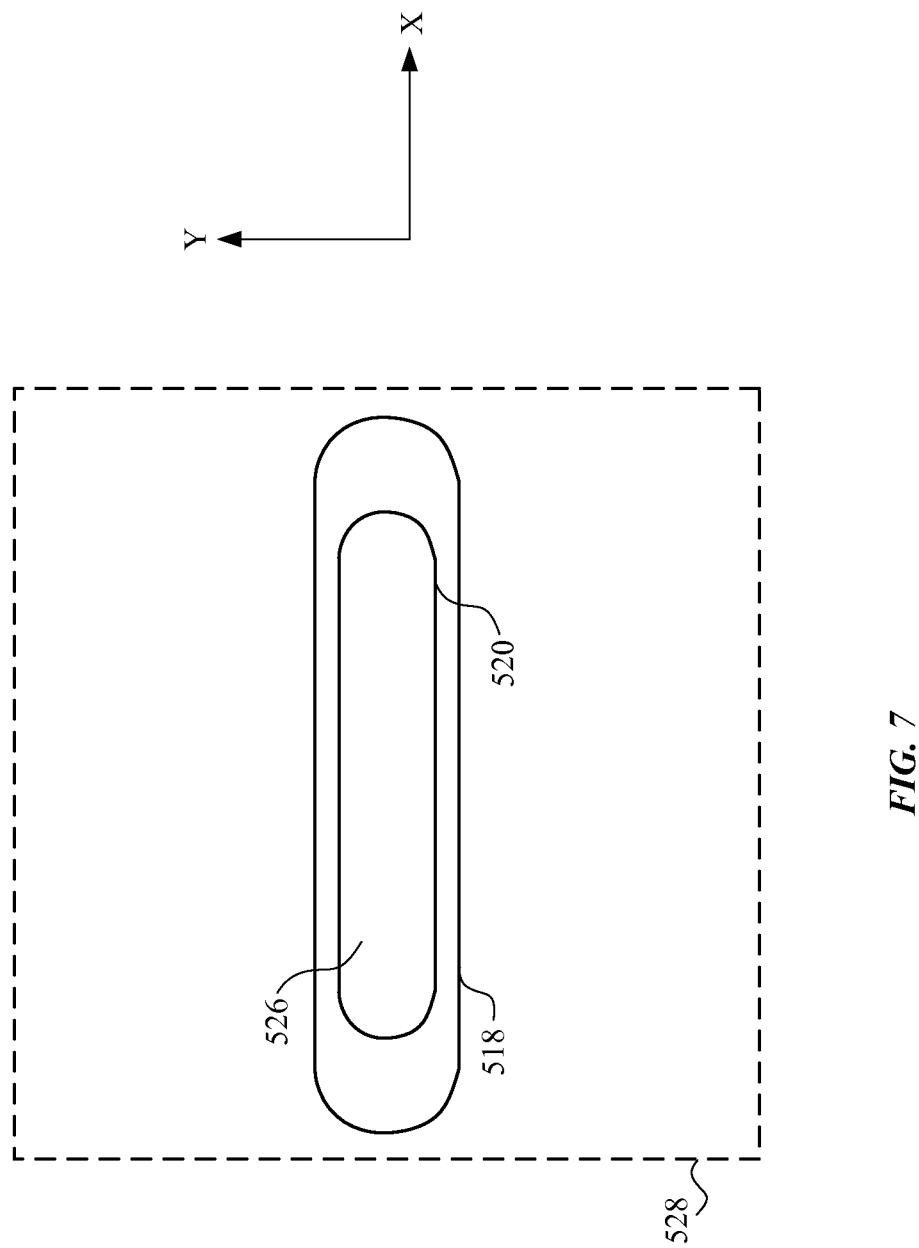
FIG. 7 illustrates the alignment between an attractor and a magnetic element according to an example embodiment of the present disclosure.

As shown in FIG. 7, which schematically illustrates a bottom view through the attractor 528 when the bottom case 104, 304 is secured to the top case 106, 306, the attractors may each define a surface area that is relatively larger than the opening 520 to a respective one of the pockets 518. By selecting the area of the attractors 528 to be larger than the openings 520 to the pockets 518, the attractors may define a larger area than the magnetic elements 526. The additional area defined by the attractors 528 may provide compliance in the X and Y-axes such that the bottom case 104, 304 is provided with horizontal compliance relative to the top case 106, 306. Accordingly, issues with respect to aligning the top case 106, 306 relative to the bottom case 104, 304 may be avoided. For example, fasteners may be directed through holes 406 (see, e.g., FIG. 4) in the bottom case 104, 304 into the top case 106, 306. Note that in alternate embodiments additional magnetic elements may be employed in place of fasteners extending through the holes 406 in the bottom case 104, 304.

Figure 9:
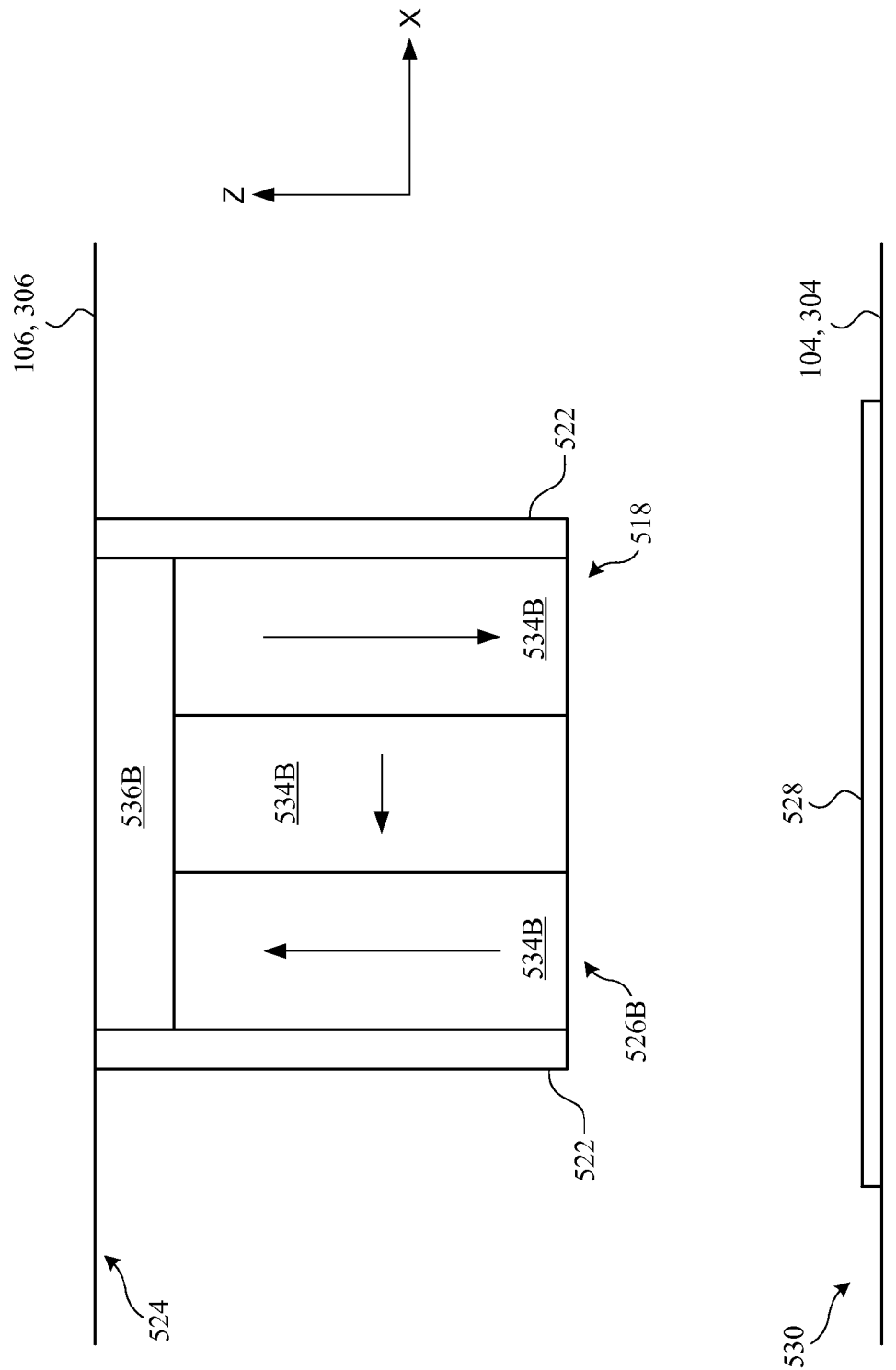
FIG. 9 schematically illustrates a side view through a magnetic element comprising a Halbach array and one shunt and an attractor according to an example embodiment of the present disclosure.
Figure 10:
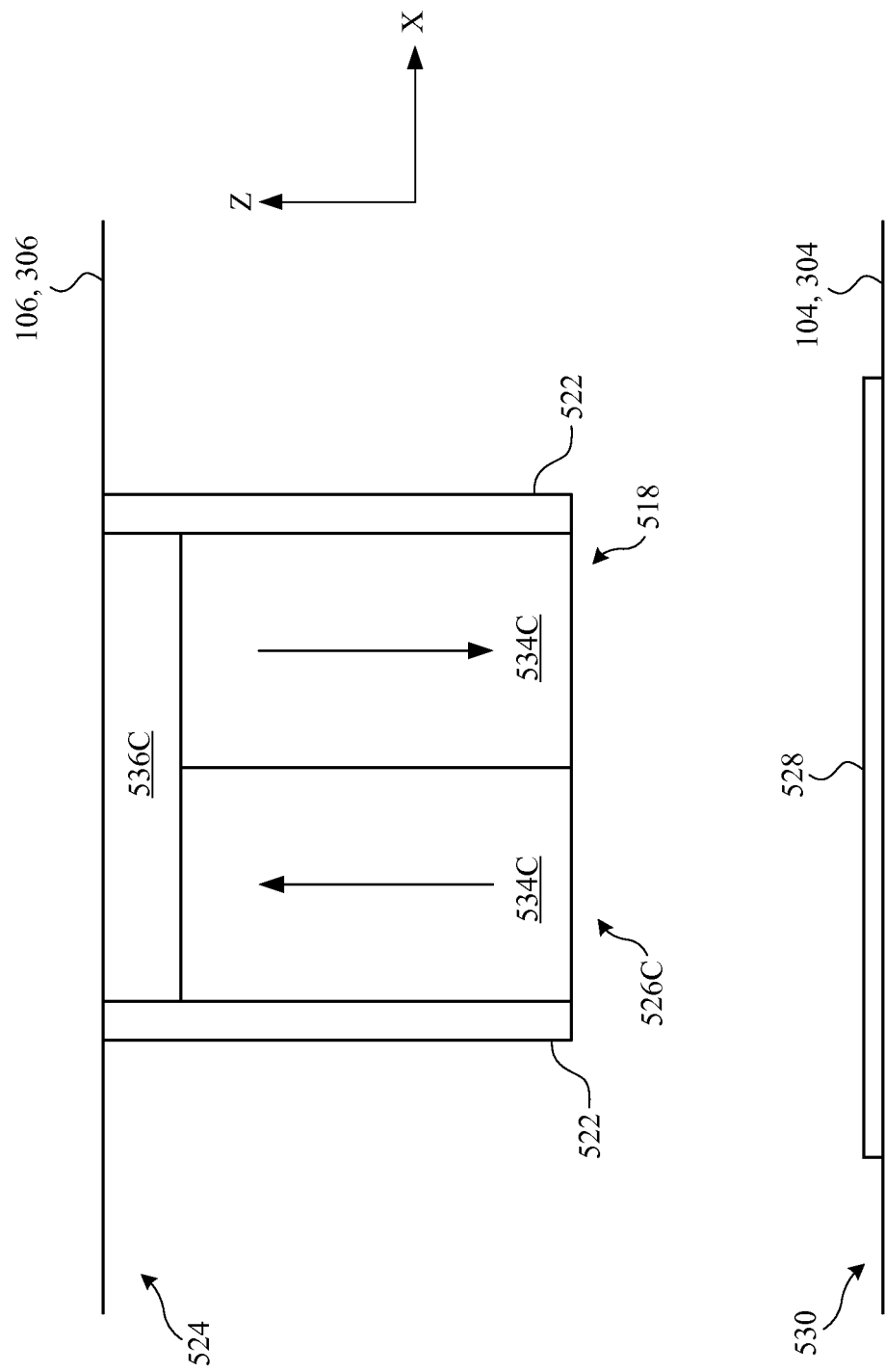
FIG. 10 schematically illustrates a side view through a magnetic element comprising two magnets and one shunt and an attractor according to an example embodiment of the present disclosure.
Figure 11:
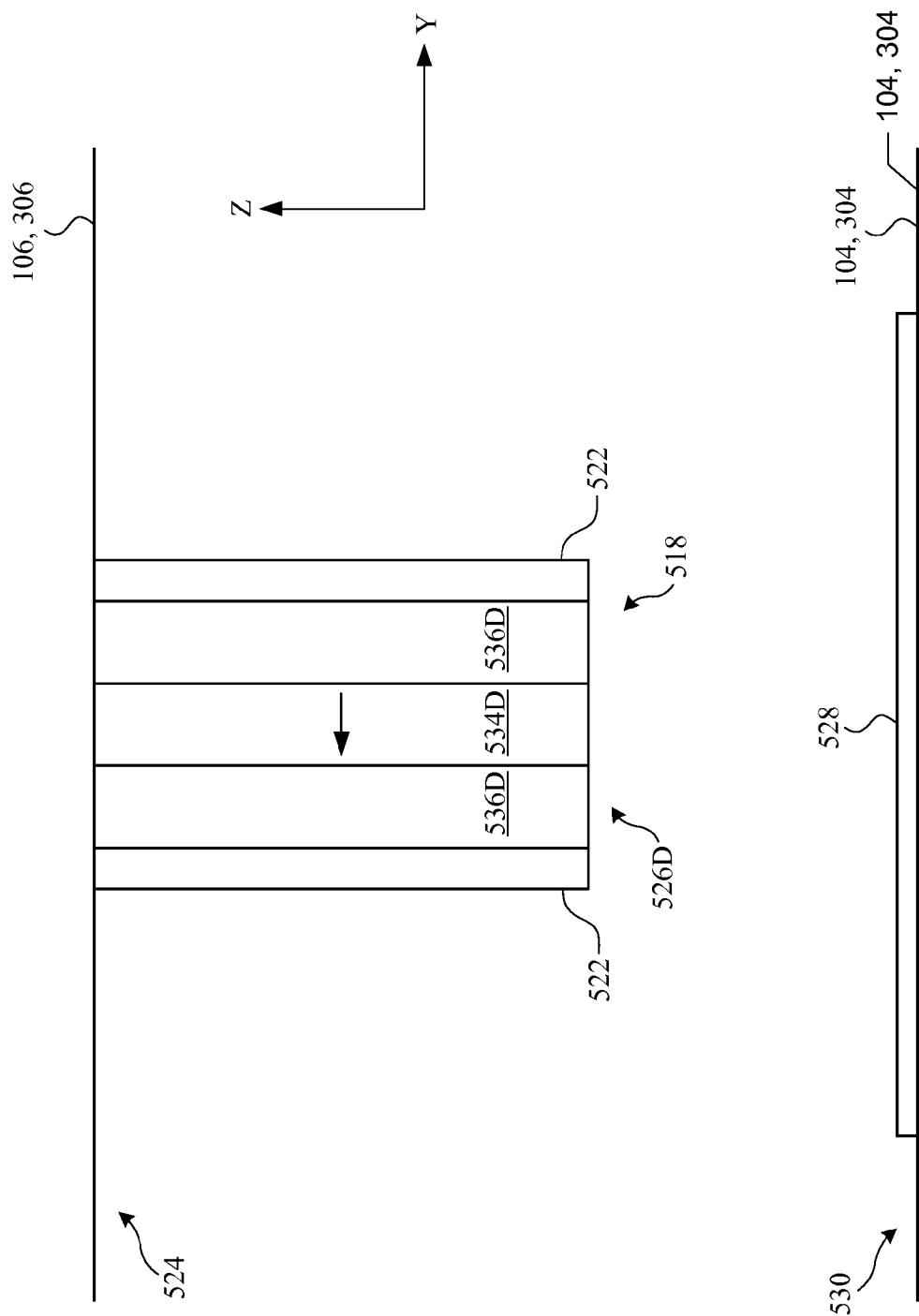
FIG. 11 schematically illustrates a side view through a magnetic element comprising one magnet sandwiched between two shunts and an attractor according to an example embodiment of the present disclosure.
Figure 12:
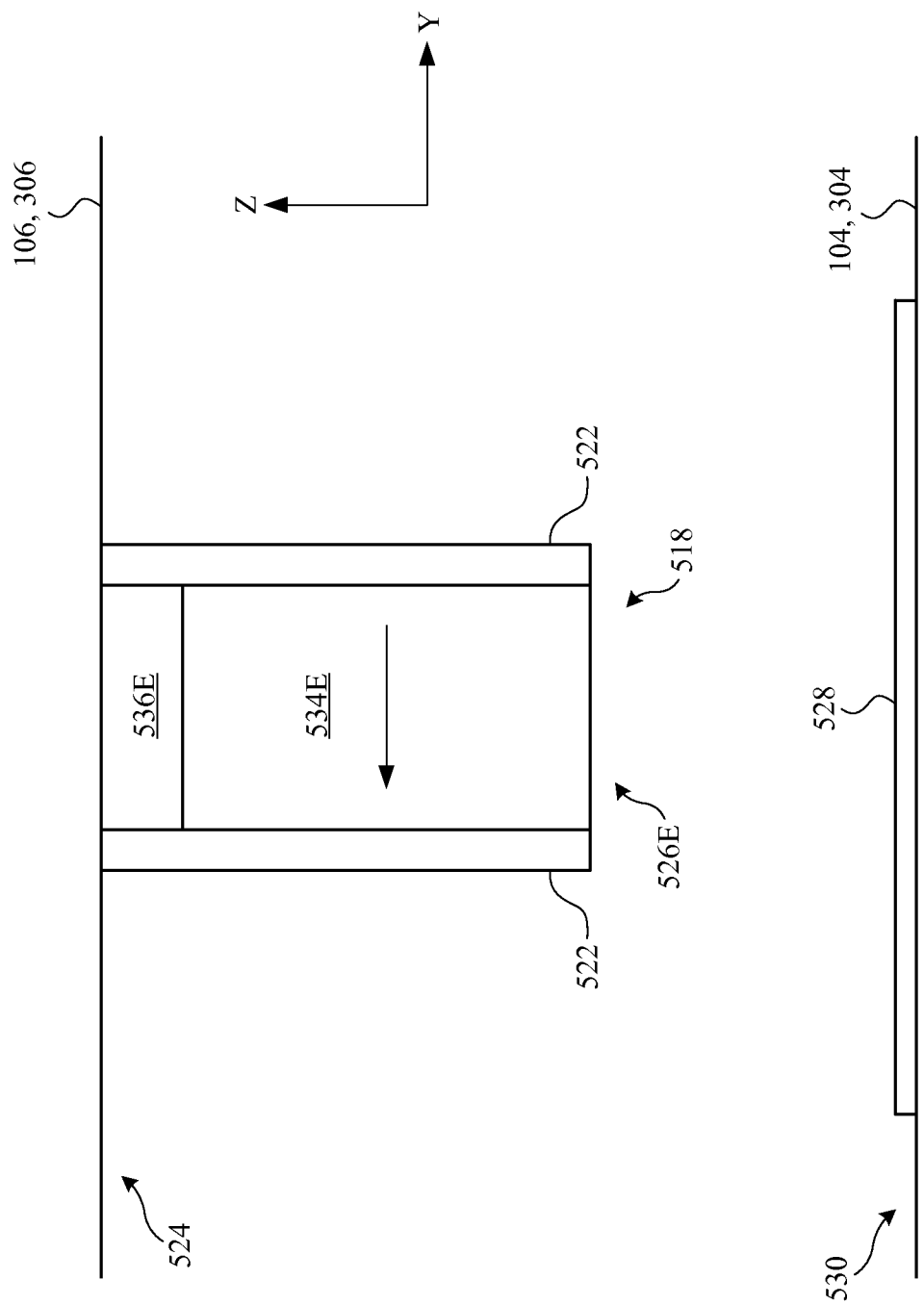
FIG. 12 schematically illustrates a side view through a magnetic element comprising one magnet with an alternate polarization configuration and one shunt and an attractor according to an example embodiment of the present disclosure.

FIGS. 8-13 schematically illustrate cross-sectional views through the housing 102, 302 illustrating embodiments of the magnetic element 526 in the pocket 518 in the wall 522. It should be understood that various other embodiments of magnetic elements may be employed, and the embodiments illustrated in FIGS. 8-13 are provided for example purposes only. FIGS. 8-10 and 13 and illustrate cross-sectional views along the Y-axis and FIGS. 11 and 12 illustrate cross-sectional views along the X-axis in terms of the axes illustrated in FIG. 4. The magnetic elements 526 may define substantially constant cross-sections along the lengths thereof, with the exception of the components thereof conforming to the shape of the pocket 518. Further, when the attractor 528 is magnetically coupled to the magnetic element 526, a gap may be defined therebetween, or the magnetic element and the attractor may contact one another. In this regard, both the magnetic element 526 and the attractor 528 may define planar surfaces configured to engage one another in some embodiments.

Figure 8:
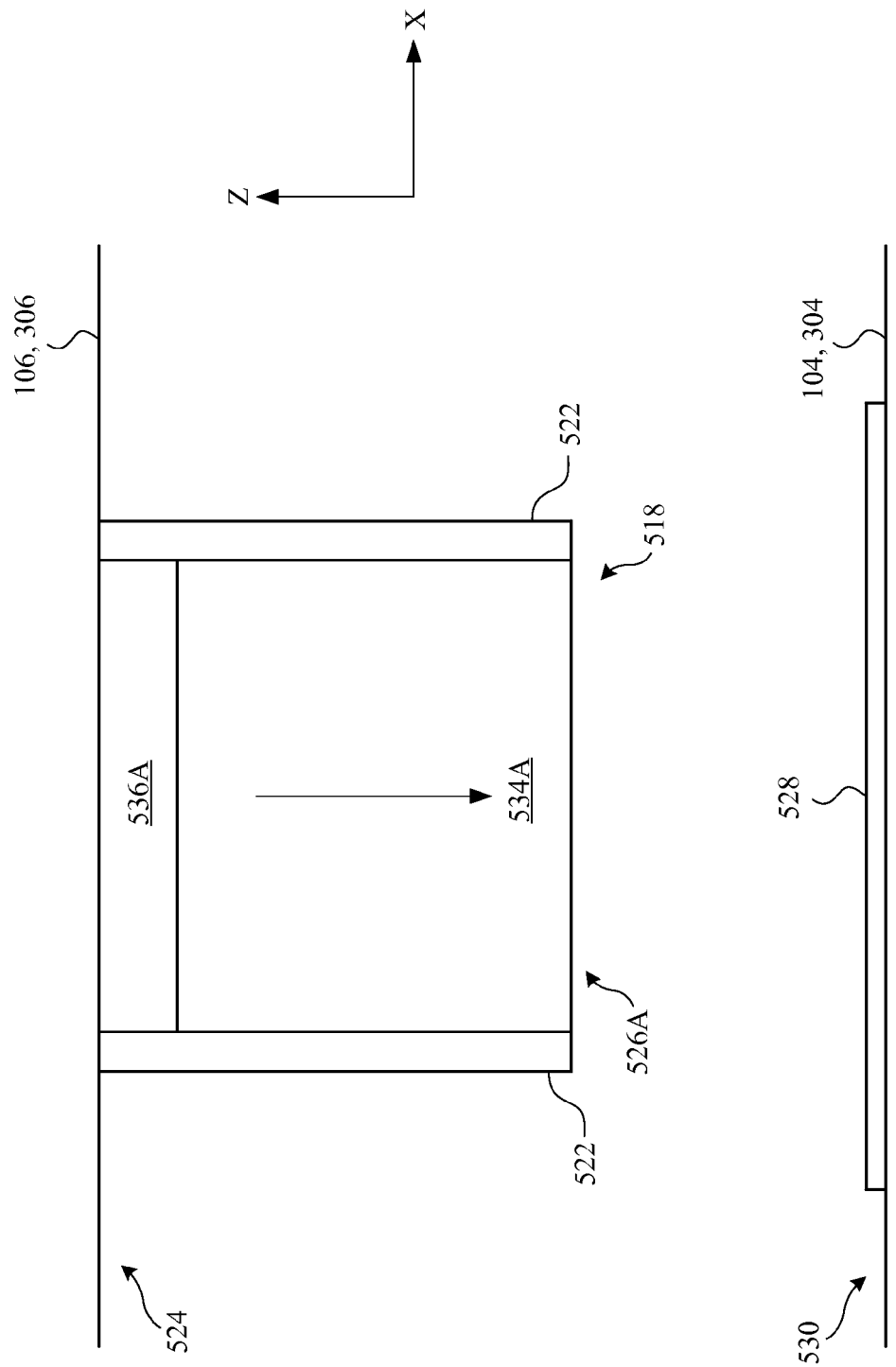
FIG. 8 schematically illustrates a side view through a magnetic element comprising one magnet and one shunt and an attractor according to an example embodiment of the present disclosure.

FIG. 8 illustrates an embodiment of the magnetic element 526A comprising one magnet 534A and one shunt 536A. The magnets disclosed herein may comprise neodymium, although various other embodiments of magnetic materials may be employed in other embodiments. The shunts may comprise a piece of low carbon steel or other iron-based material. The shunts may be configured to divert and directionalize a magnetic field produced by the magnet in a desired direction. In this regard, the shunts may be configured to direct the magnetic field produced by the magnets associated therewith through the opening 520 to the pocket 518. Accordingly, the magnetic field produced by the magnetic elements 526 may attract the attractor 528 while limiting the amount of magnetic field extending in other directions. Thereby, for example, issues with respect to flux leakage outside of the housing 102, 302 or into a mass storage device 538 (see, e.g., FIG. 6) in the portable computing device may be avoided.

Returning to FIG. 8, the particular embodiment of the magnetic element 526A illustrated therein includes the shunt 536A positioned in the pocket 518 between the inner surface 524 of the top case 106, 306 and the magnetic element. Accordingly, the magnetic field may be directed along the Z-axis. For example, the magnetic field may be directed toward the attractor 528, as illustrated.

FIG. 9 illustrates an embodiment in which the magnetic element 526B comprises a Halbach array of three magnets 534B that form a horseshoe-shaped magnetic field. A shunt 536B may be positioned between the magnets 534B and the inner surface 524 of the top case 106, 306 as described above.

FIG. 10 illustrates a magnetic element 526C comprising a modified Halbach array of two magnets 534C. This arrangement also produces a horseshoe-shaped magnetic field while employing one less magnet, which may thus reduce the cost thereof. A shunt 536C may be positioned between the magnets 534C and the inner surface 524 of the top case 106, 306 as described above.

FIG. 11 illustrates a magnetic element 526D comprising a magnet 534D positioned between two shunts 536D on opposing sides thereof along the Y-axis. The magnetic element 526D may produce a relatively stronger magnetic force at short distances and a relatively lesser magnetic force at longer distances, as compared to the Halbach array illustrated in FIG. 9.

FIG. 12 illustrates a magnetic element 526E comprising one magnet 534E with a shunt 536E positioned between the inner surface 524 of the top case 106, 306 and the magnet. However, in contrast to the embodiment of the magnetic element 526A illustrated in FIG. 8, the magnetic element 526E is polarized along the Y-axis.

Figure 13:
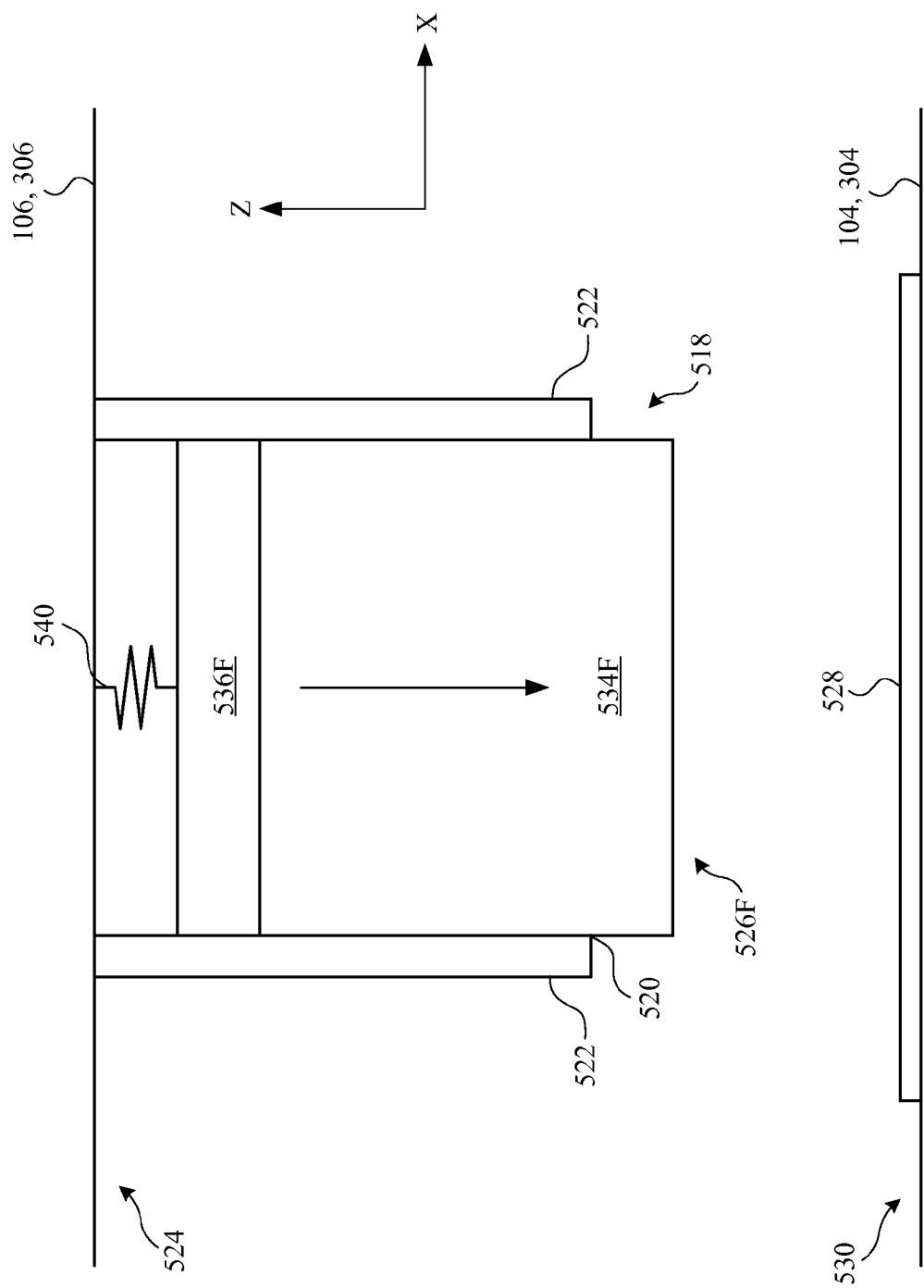
FIG. 13 schematically illustrates a side view through the magnetic element and attractor of FIG. 8 further comprising a spring according to an example embodiment of the present disclosure.

FIG. 13 illustrates a magnetic element 526F comprising one magnet 534F with a shunt 536F positioned between the inner surface 524 of the top case 106, 306 and the magnet. Further, the magnet 534F is polarized along the Z-axis. Accordingly, the magnetic element 526F is substantially similar to the magnetic element 526A illustrated in FIG. 8. However, FIG. 13 differs in that a spring 540 is positioned between the magnetic element 526F and the inner surface 524 of the top case 106, 306.

The spring 540, which may be included with any of the embodiments of magnetic elements 526 disclosed herein, may be configured to bias the magnetic element 526 toward the opening 520 to the pocket 518. For example, the spring 540 may bias the magnetic element 526 outwardly therefrom or allow the magnetic element to move outwardly therefrom, as illustrated in FIG. 13. Accordingly, by displacing the magnetic element 526 toward the opening 520 to the pocket 518, an initial separation distance between the magnetic element and the attractor 528 may be reduced such that magnetic coupling therebetween may be encouraged. In embodiments in which the attractor 528 contacts the magnetic element 526, the spring 540 may compress after engagement therebetween (e.g., due to use of fasteners extending through the holes 406 in the bottom case 104, 304 to the top case 106, 306), or the magnetic element may be fully received in the pocket 518 in the unbiased configuration. The spring 540 may comprise various embodiments, such as a coil spring, or an elastomeric material such as a foam or rubber.

Figure 14:
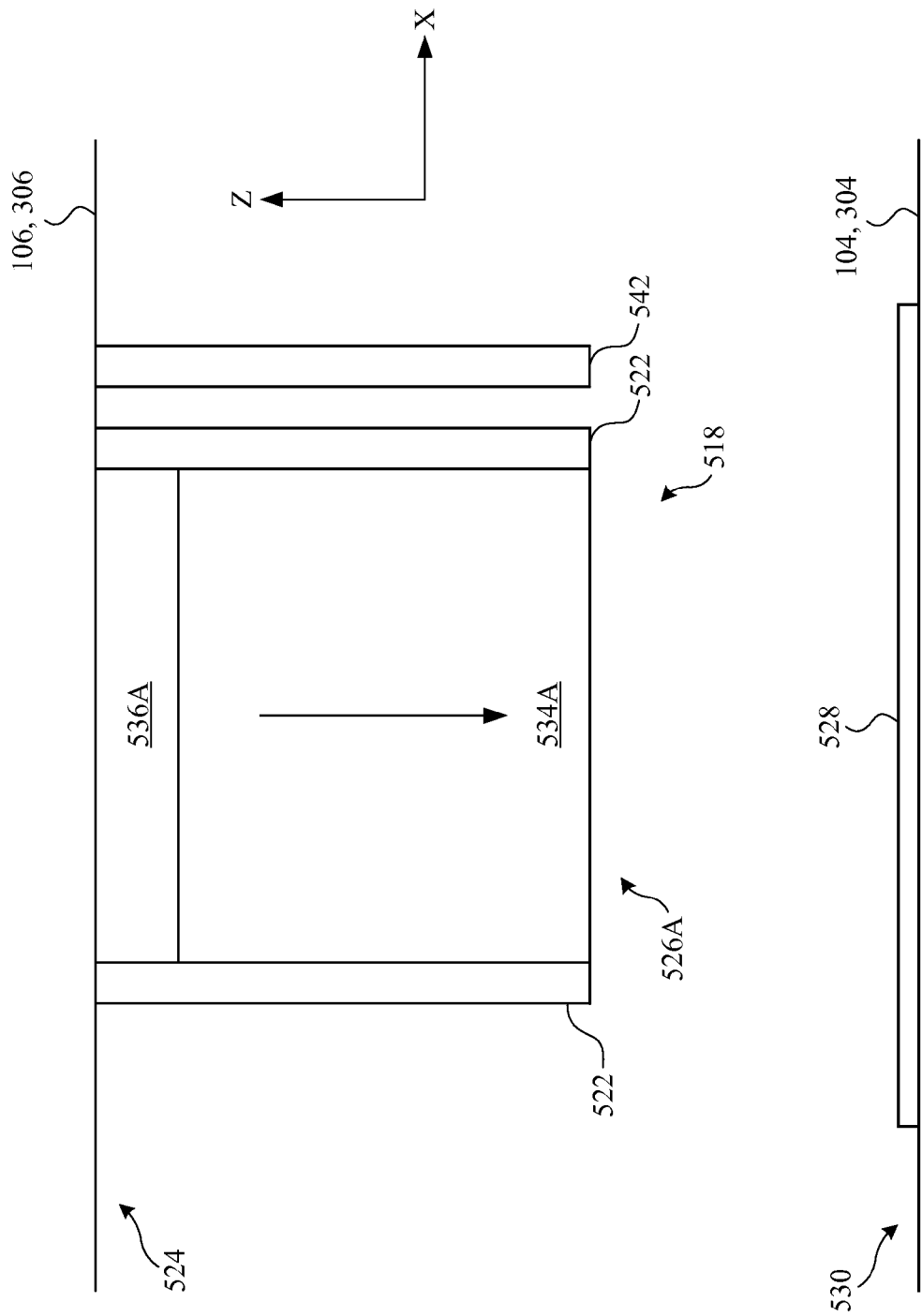
FIG. 14 schematically illustrates a side view through the magnetic element and attractor of FIG. 8 further comprising a Hall Effect sensor according to an example embodiment of the present disclosure.

FIG. 14 illustrates the magnetic element 526A, as described above with respect to FIG. 8. However, a Hall Effect sensor 542 is also provided. The Hall Effect sensor 542, which may be employed with any of the embodiment of magnetic elements 526 disclosed herein, may be configured to detect a change in the magnetic field associated with magnetic decoupling of the magnetic element 526 from the attractor 528. Thus, the Hall Effect sensor 542 may be configured to detect removal of the bottom case 104, 304 from the top case 106, 306. Accordingly, for example, the Hall Effect sensor 542 may be configured to detect when a user has accessed internal components within the housing 102, 302 defined by the top case 106, 306 and the bottom case 104, 304.

The portable computing device may include additional features configured to facilitate use thereof. As illustrated in FIG. 3, the lid portion 308 and the housing 302 may be hingedly coupled at respective proximal edges 602, 604 and respectively extend to distal edges 606, 608. In order to assist in releasably retaining the lid portion 308 in a closed configuration with respect to the housing 302, the lid portion and the housing may respectively include magnetic elements 610 and attractors 612. Various embodiments of magnetic elements and attractors may be employed as described above. Further, the magnetic elements 610 may be positioned at the lid portion 308 and the attractors 612 may be positioned at the housing 302 in an alternate embodiment.

The magnetic elements 610 may attract the lid portion 308 such that it may be releasably retained in a closed configuration. As illustrated, the magnetic elements 610 and attractors 612 may be positioned near the distal edges 606, 608 of the housing 302 and the lid portion 308. However, by placing the magnetic elements 610 and attractors 612 at these locations, it may be difficult for a user to open the lid portion 308. In this regard, the user may open the lid portion 308 by grasping the lid portion at the distal edge 608 thereof. Accordingly, the user may have to overcome the full magnetic force produced at the distal edge 608 of the lid portion 308, which has a relatively large moment arm.

Accordingly, as further illustrated in FIG. 3, magnetic elements 614 and attractors 616 may be respectively positioned on the housing 302 and the lid portion 308 (or vice versa) at an alternate location. In particular, as illustrated, the magnetic elements 614 and the attractors 614 may be substantially centered with respect to the proximal edges 602, 604 and the distal edges 606, 608 thereof. Accordingly, a user may not have to directly overcome the magnetic force, and the moment arm of the magnetic force may be reduced.

Further, by securing the lid portion 308 between the proximal 602, 604 and distal 606, 608 edges, the center of the lid portion may not tend to bow outwardly relative to the housing 302, as may occur when they are magnetically secured at the distal edges. Additionally, positioning the magnetic elements 614 and the attractors 616 between the proximal edges 602, 604 and the distal edges 606, 608 of the housing 302 and the lid portion 308, and substantially in alignment with the center of gravity of the personal computing device may assist the magnetic elements and the attractors in retaining the lid portion 308 in a closed configuration during a drop event. Accordingly, positioning the magnetic elements 614 and the attractors 616 between the proximal edges 602, 604 and the distal edges 606, 608 of the housing 302 and the lid portion 308 may be preferable. Note that this arrangement may be employed in other embodiments of the personal computing device described herein.

In some embodiments the magnetic elements disclosed herein may be configured in accordance with the disclosure provided in U.S. Pat. No. 7,486,165 to Ligtenberg et al. and U.S. Pat. No. 7,583,500 to Ligtenberg et al., which are incorporated herein by reference in their entirety.

Figure 15:
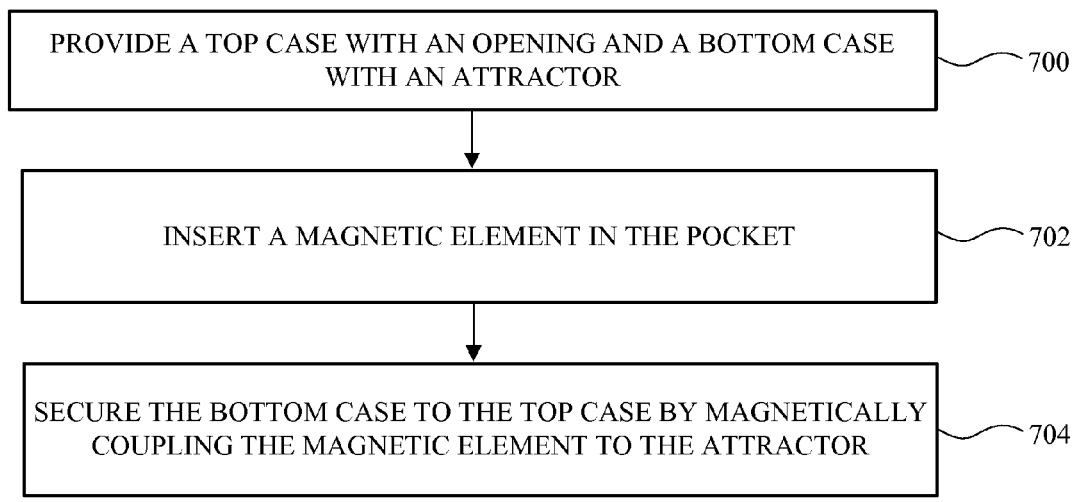
FIG. 15 schematically illustrates a method for magnetically coupling a top case and a bottom case according to an example embodiment of the present disclosure.

A related method is also provided. As illustrated in FIG. 15, the method may include providing a top case defining a pocket with an opening and providing a bottom case with an attractor positioned at an inner surface thereof at operation 700. Further, the method may include inserting a magnetic element in the pocket in the top case at operation 702. The magnetic element may comprise a magnet configured to produce a magnetic field and a shunt configured to direct the magnetic field through the opening to the pocket. The method may additionally include securing the bottom case to the top case by magnetically coupling the magnetic element to the attractor at operation 704.

In some embodiments the method may further comprise coupling the attractor to the inner surface of the bottom case. The method may also include fastening the bottom case to the top case with a plurality of fasteners. Additionally, the method may include positioning a Hall Effect sensor proximate the magnetic element. The Hall Effect sensor may be configured to detect a change in the magnetic field associated with magnetic decoupling of the magnetic element from the attractor during removal of the bottom case from the top case.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. A housing for a portable computing device, the housing comprising:
   a top case having a pocket protruding from an inner surface of the top case, the pocket positioned within a central region of the top case and having a shape and size for accommodating a magnetic element configured to produce a magnetic field; and
   a bottom case that cooperates with the top case when in a secured configuration to define a volume for accommodating components of the portable computing device, the bottom case including a magnetic attractor that magnetically couples with the magnetic element of the top case aligning the top case relative to the bottom case and maintaining a shape of the top case and the bottom case when in the secured configuration.

2. The housing of claim 1, wherein edges of the top case are aligned with edges of the bottom case when the magnetic attractor is magnetically coupled with the magnetic element.

3. The housing of claim 1, wherein the housing is configured to be hingedly coupled to a lid portion of the portable computing device.

4. The housing of claim 1, wherein a peripheral region of the top case is secured to the bottom case by a fastener when top case is secured to the bottom case.

5. The housing of claim 4, wherein the fastener is positioned proximate to a clutch assembly of the portable computing device, the clutch assembly configured to pivotally couple a lid portion of the portable computing device to the housing.

6. The housing of claim 1, wherein a peripheral region of the top case is secured to the bottom case by a plurality of fasteners positioned proximate one or more edges of the bottom case.

7. The housing of claim 1, wherein the magnetic attractor defines a surface area that is larger than a surface area of the pocket.

8. The housing of claim 1, wherein the pocket is part of a wall of the top case.

9. The housing of claim 8, wherein the wall separates at least two components within the volume, wherein the wall limits an amount of the magnetic field reaching the at least two components.

10. A portable computing device, comprising:
    a housing configured to be hingedly coupled to a lid portion of the portable computing device, the housing comprising:
       a first section having perimeter walls defining an interior region configured to accommodate internal components of the portable computing device, the first section having an internal wall positioned within the interior region, wherein the internal wall includes a magnetic element positioned therein configured to produce a magnetic field, and
       a second section configured to couple with the first section and enclose the interior region, the second section including a magnetic attractor that magnetically couples with the magnetic element of the first section aligning the first section relative to the second section.

11. The portable computing device of claim 10, wherein the first section is secured to the second section by a fastener.

12. The portable computing device of claim 11, wherein fastener is within a peripheral region of the second section.

13. The portable computing device of claim 10, wherein the first section is shaped to accommodate one or both of a keyboard module and a touch sensitive device.

14. The portable computing device of claim 10, wherein the second section includes a plurality of fasteners that cooperate to mechanically couple the second section with the first section.

15. The portable computing device of claim 14, wherein a first portion of the plurality of fasteners is positioned proximate a first edge of the second section, and a second portion of the plurality of fasteners is positioned proximate a second edge of the second section opposite the first edge.

16. The portable computing device of claim 14, wherein the plurality of fasteners is positioned at corner regions of the second section.

17. A method of forming a housing of a portable computer, the housing comprising a top case and a bottom case, the method comprising:
- positioning a magnetic element within a pocket of the top case, the pocket protruding from an inner surface of the top case and positioned within a central region of the top case, the magnetic element configured to produce a magnetic field; and
- aligning the bottom case relative to the top case by magnetically coupling the magnetic element to a magnetic attractor of the bottom case, wherein when the bottom case and top case are aligned, the bottom case cooperates with the top case to define a volume configured to accommodate components of the portable computer.

18. The method of claim 17, wherein magnetically coupling the magnetic element to the magnetic attractor maintains a shape of the top case and the bottom case when in a secured configuration.

19. The method of claim 17, further comprising:
- securing the top case to the bottom case using a fastener.

20. The method of claim 19, wherein the fastener is positioned within a peripheral region of the bottom case.

* * * * *